United States Patent
Clevenger et al.

(12)

(10) Patent No.: US 6,452,110 B1
(45) Date of Patent: Sep. 17, 2002

(54) PATTERNING MICROELECTRONIC FEATURES WITHOUT USING PHOTORESISTS

(75) Inventors: Lawrence A. Clevenger, LaGrangeville, NY (US); Louis L. Hsu, Fishkill, NY (US); Carl J. Radens, LaGrangeville, NY (US); Li-Kong Wang, Montvale, NJ (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/897,889

(22) Filed: Jul. 5, 2001

(51) Int. Cl.[7] .................................................. H05K 1/09
(52) U.S. Cl. ........................... 174/257; 29/846; 29/847; 204/157.15; 427/508; 427/510
(58) Field of Search .................................. 174/257, 261; 29/825, 846, 847, 849; 204/157.15; 427/508, 510

(56) References Cited

U.S. PATENT DOCUMENTS 6,021,050 A    2/2000   Ehman et al.
6,210,537 B1 *  4/2001   Murphy et al. ........ 204/157.15

FOREIGN PATENT DOCUMENTS

JP    402273926 A  * 11/1990
JP    407058439 A  *  3/1995

* cited by examiner

*Primary Examiner*—Albert W. Paladini
(74) *Attorney, Agent, or Firm*—McGinn & Gibb, PLLC; Marian Underweiser, Esq.

(57) ABSTRACT

A method and structure for producing metallic polymer conductor lines comprising of an alternative methodology to a traditional damascene approach, called a cloisonne or inverse damascene approach. The cloisonne approach comprises the steps of coating a photosensitive polymer such as pyrrole or aniline with a silver salt on a semiconductor substrate. Using standard photolithography and resist developing techniques, the conducting polymer is exposed to a wet chemical developer, removing a portion of the exposed conducting polymer region, leaving only conducting polymer lines on top of the substrate. Next, an insulating dielectric layer is deposited over the entire structure and a chemical mechanical polish planarization of the insulator is performed creating the conducting polymer lines. Included in another aspect of the invention is a method and structure for a self-planarizing interconnect material comprising a conductive polymer thereby reducing the number of processing steps relative to the prior art.

20 Claims, 7 Drawing Sheets

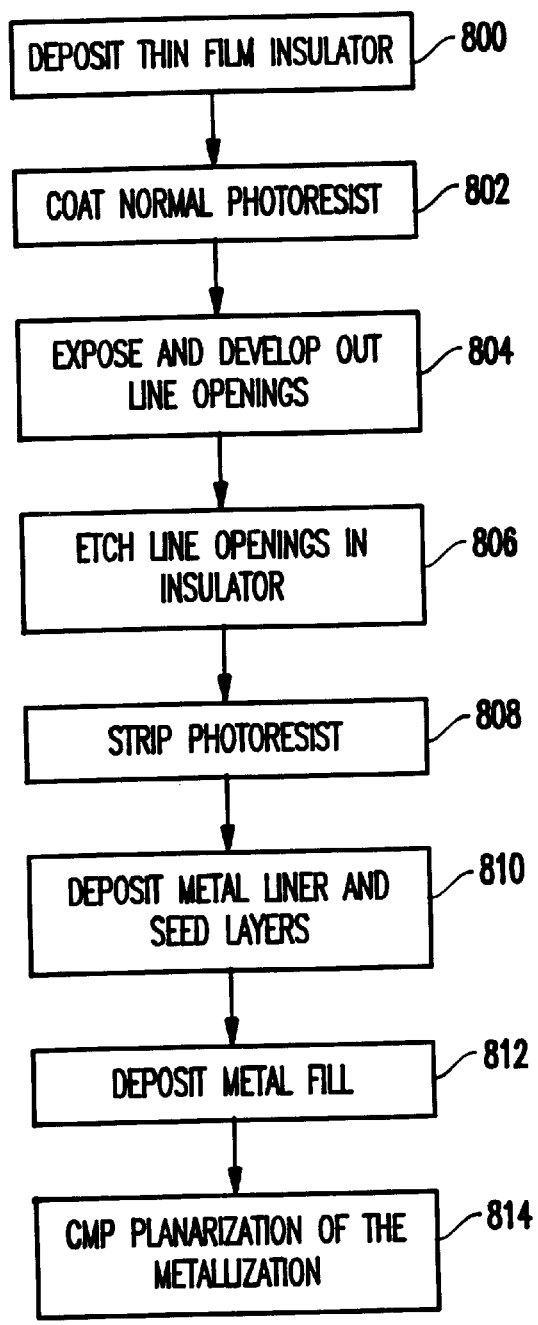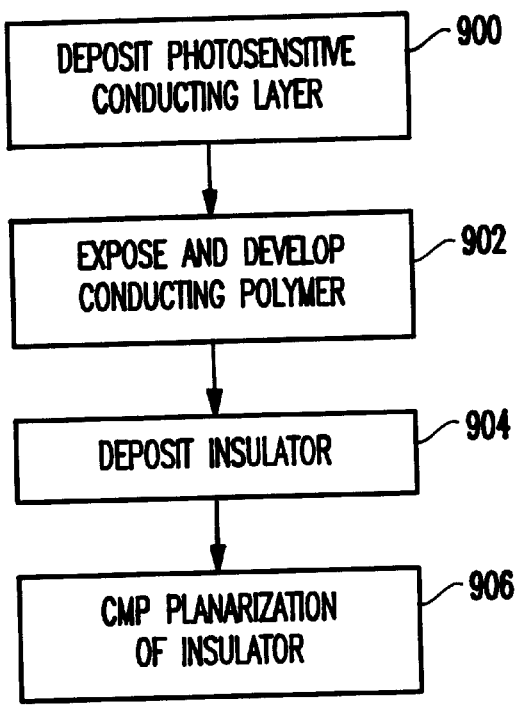

PATTERNING MICROELECTRONIC FEATURES WITHOUT USING PHOTORESISTS

BACKGROUND OF THE INVENTION

1. Field of the Invention

The present invention generally relates to integrated circuit storage devices and more particularly to an improved method for producing electrically conductive embedded lines in an insulating dielectric layer.

2. Description of the Related Art

An integrated circuit, or any other semiconductor device is constructed to have several electronic circuit elements interwoven on a single body of semiconductor material. The various circuit elements, such as amplifiers, conductors, diodes, resistors, and transistors, to name a few, are integrated through conductive connectors to form a complete circuit which can contain millions of individual circuit elements. Technological advances in semiconductor material selection and other processing techniques have resulted in allowing for an increased number of individual circuit elements on a single semiconductor body, while reducing the overall size of the individual circuit elements. This reduction in overall size yields a reduction in costs, yet an improvement in the integrated circuit performance.

The manner in which the various circuit elements communicate with one another is accomplished by interconnects, which provide the electrical connections between each element of the semiconductor device. Moreover, these interconnect lines form the connections between the internal circuit elements and the semiconductor's external contact elements, such as pins, for connecting the integrated circuit to other integrated circuits or devices. Generally, a mesh of layered connections results from the interconnect lines, which form the horizontal connections between internal circuit elements, and the conductive via plugs, which form the vertical connections between the internal circuit elements.

One method for producing these interconnect micron and sub micron metallic conducting lines embedded in an insulating dielectric layer is called a damascene process, with the resulting structure called a damascene structure. This structure and process are very well known to those skilled in the art. A damascene process is one kind of interconnect process. In a typical damascene process, a trench is formed in a dielectric layer. Then, a metal layer is formed in the trench to form a conductive line as an interconnect. Similarly, a dual damascene process is one type of multilevel interconnect process. Here, a contact or a via is additionally formed as an interconnect.

Usually, in a conventional damascene process, a dielectric layer is formed over a semiconductor substrate. In some processes an oxide layer is formed on top of the dielectric layer. Then, a chemical-mechanical polishing (CMP) process is performed to planarize the dielectric layer. Next, a patterned photoresist layer is formed on the dielectric layer. Thereafter, using the photoresist layer as a mask, the dielectric layer is etched by dry etching to form a trench in the substrate. At this time, the photoresist layer is removed, perhaps by oxygen plasma. Next, metal liner and seed layers are deposited, followed by another metallization process to completely fill the lines. Finally, a metal CMP process is performed to remove the excess metal from the areas between the trenches leaving conducting metal in the trenches. In dual and other multiple damascene processes, the number of dielectric layers are multiplied, whereby the number of mask layers are correspondingly added. These processes are rather complex and require many more processing steps to complete. The prior art damascene process has the disadvantage of requiring etching of the insulating layer and/or requiring multiple metalization deposition steps contrary to the current disclosure. As indicated above, the prior art damascene structures are created with numerous processing steps.

SUMMARY OF THE INVENTION

In view of the foregoing and other problems, disadvantages, and drawbacks of the conventional damascene process the present invention has been devised, and it is an object of the present invention to provide an alternative simplified methodology for the formation of an electronic interconnect structure relative to the traditional damascene approach of the prior art. This simplified method will provide a low-cost means for microfabrication manufacturing. The present method is simplified relative to prior art, in one respect, because there are fewer fabrication steps.

Another object of this invention is to create a planar structure of a patterned conductive polymer. A planar structure is desired in order to improve the patterning lithographic steps for subsequent fabrication processes by making a large depth-of-focus margin for exposure by the elimination of on-chip step height differences.

Still another object of this invention is to produce a method and structure for a self-planarizing interconnect material comprised of a conductive polymer. The polymer will self-planarize during a spin-on deposition. The self-planarizing aspect of the conductive polymer will result in a reduced number of fabrication process steps relative to the prior art, and will result in an improved depth-of-focus margin for subsequent lithographic patterning steps.

Yet another object of the present invention is to provide a method for the microfabrication of conductive elements comprised of photosensitive conductive polymer materials.

In order to attain the objects suggested above, there is provided, according to one aspect of the invention an alternative methodology for a damascene process. The present invention provides for a novel "cloisonne" or "inverse damascene" approach. In the cloisonne approach, the use of a photosensitive conducting polymer, which acts as both a masking and conducting layer, is employed. The advantage of the cloisonne approach is that it takes fewer processing steps to end up with a similar final structure produced by the damascene approach. Consequently, this reduction of processing steps reduces processing time and reduces overall costs in semiconductor manufacturing.

More specifically, the cloisonne approach comprises the steps of coating a photosensitive polymer such as pyrrole or aniline with a silver salt on a semiconductor substrate. Then, using standard photolithography and resist developing techniques, the conducting polymer is exposed to a wet chemical developer, which removes a portion of the exposed conducting polymer region, leaving only conducting polymer lines on top of the substrate. Next, an insulating dielectric layer is deposited over the entire structure and a chemical mechanical polish (CMP) planarization of the insulator is performed creating the conducting polymer lines. Another aspect of the present invention involves a method and structure for a self-planarizing interconnect material comprising a conductive polymer, thereby reducing the number of processing steps relative to the prior art. Here, the method for producing metallic polymer conductor lines comprises the steps of depositing a self-planarizing conductive polymer material on a substrate using a spin-on application, and then patterning the conductive polymer material using either lithographic and dry etch techniques or by exposing a photosensitive component of the conductor polymer.

In the current disclosure, damascene structures are created with far fewer processing steps. Basically, with the present invention, a photosensitive conducting polymer film is deposited on a substrate. The conductor is then exposed and developed for forming conducting lines. An insulating layer is then deposited and polished by CMP back to the conducting polymer, resulting in an inverse damascene structure.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 8 is a flow diagram illustrating a conventional damascene process.

FIG. 9 is a flow diagram illustrating a preferred method of the present invention.

DETAILED DESCRIPTION OF PREFERRED EMBODIMENTS OF THE INVENTION

As mentioned above, there is a need to simply the processing steps in a traditional damascene process. The invention addresses this need by providing a simplified approach for producing micron and sub micron metallic conducting lines embedded in an insulating dielectric layer. In a preferred embodiment, an alternative methodology to the "damascene" approach which is being referred to as the "cloisonne" or "inverse damascene" approach is disclosed.

Figure 1:
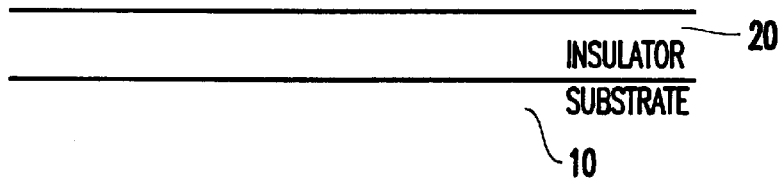
FIG. 1 is a cross-sectional view of a first step in a conventional damascene process.

Referring now to the drawings, and more particularly to FIGS. 1 through 4, there are shown the conventional embodiments of the damascene method and structure. The prior art method of producing conducting lines embedded in an insulating matrix is called the damascene process. The prior art damascene process has the disadvantage of requiring etching of the insulating layer and/or requiring multiple metalization deposition steps contrary to the current disclosure. With the traditional damascene process, a thin film insulator 20 is first deposited on top of a substrate 10 as shown in FIG. 1.

Figure 2:
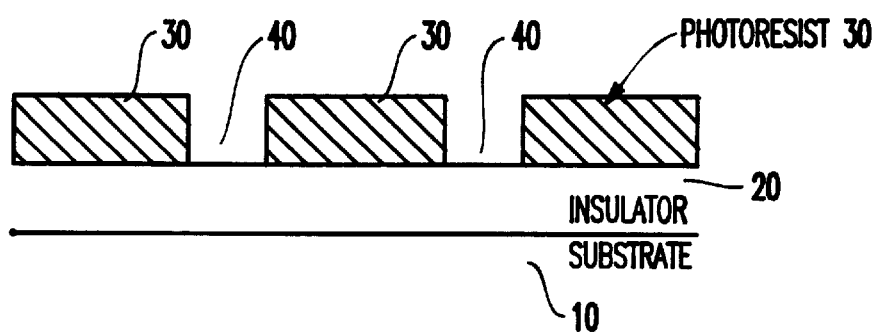
FIG. 2 is a cross-sectional view of a second step in a conventional damascene process.

FIG. 2 shows an industry standard photoresist 30, which is a nonconducting photosensitive polymer, coated on top of the insulator 20. Next, the layer is exposed with radiation and is then exposed to a wet chemical developer which removes the regions 40 of the resist which were illuminated with radiation.

Figure 3:
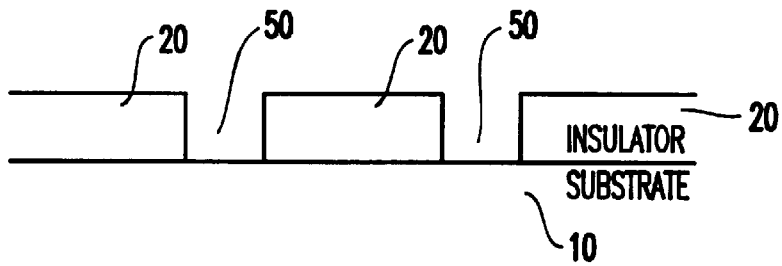
FIG. 3 is a cross-sectional view of a third step in a conventional damascene process.

Next, FIG. 3 shows a plasma etch process being used which etches micron and/or submicron openings 50 in the underlying insulator and then the photoresist 30 is stripped off using a oxygen plasma. This results in trenches 50 being formed in the insulator.

Figure 4:
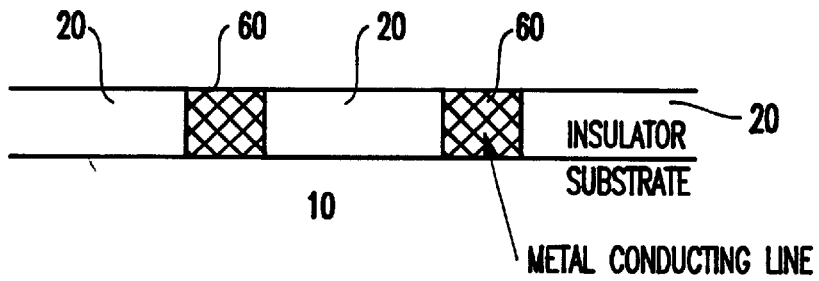
FIG. 4 is a cross-sectional view of a fourth step in a conventional damascene process.

FIG. 4 illustrates the next step of depositing a metal liner and seed layers followed by a metal fill layer, collectively referred to as a metal conducting line 60, in the trenches 50. Finally, chemical mechanical polishing (CMP) of the metallization layer is then performed, which results in the metal lines 60 imbedded in the insulating matrix.

Figure 5:
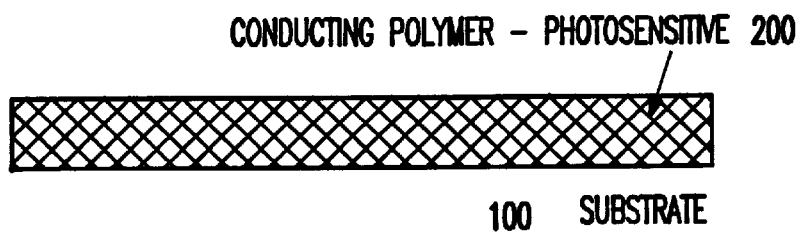
FIG. 5 is a cross-sectional view of a first step in a process for manufacturing a semiconductor device according to the present invention.
Figure 6:
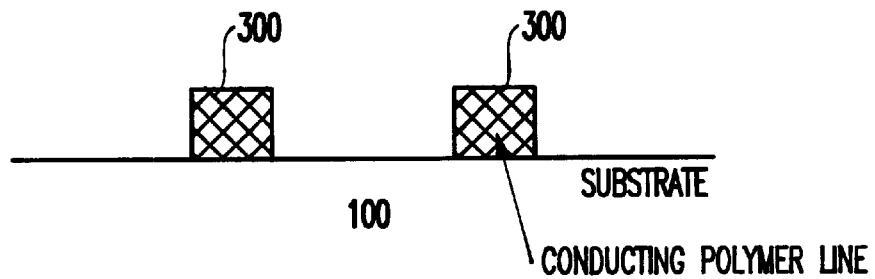
FIG. 6 is a cross-sectional view of a second step in a process for manufacturing a semiconductor device according to the present invention.
Figure 7:
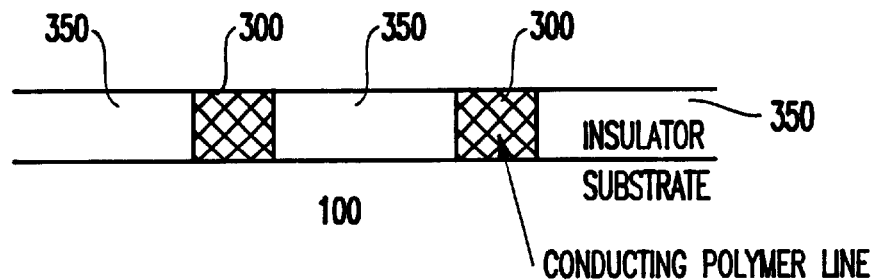
FIG. 7 is a cross-sectional view of a third step in a process for manufacturing a semiconductor device according to the present invention.

An example of the inventive cloisonne approach as suggested in the present disclosure is shown in FIGS. 5 through 7. The resulting structures produced by the cloisonne approach (FIG. 7) and the damascene approach (FIG. 4) are similar, but the number of steps required to produce this structure is far less with the inventive cloisonne method. Some advantages with the cloisonne method are that no etching of the insulating layer is required and no metallization steps are required since a conducting polymer is used as opposed to the traditional photoresist 30 in the conventional damascene approach.

The descriptions for both the prior art damascene approach and the present cloisonne approach are for single levels of metallization embedded in an insulating matrix. Similar benefits of the cloisonne approach over the damascene approach for multilevel builds are also found; i.e., there are fewer processing steps to build a multilevel structure with the cloisonne approach as opposed to the damascene approach.

However, as would be known to one ordinarily skilled in the art given this disclosure, the invention is not limited to the example shown and is applicable to all similar structures. Referring now to the drawings, and more particularly to FIG. 5, there are shown preferred embodiments of the method and structures according to the present invention.

In FIG. 5, for the cloisonne approach, a photosensitive conducting polymer 200, such as pyrrole or aniline (with a silver salt as suggested in "Photolithographically-patterned electroactive films and electrochemically modulated diffraction gratings", Kirk S. S., Troy, S. Bergstedt, Brian T. H. and Carla S. P. Cavalaheiro, Langmuir, 2000, 16, p. 795–810; and U.S. Pat. No. 5,919,402 "Electronically conducting polymers with silver grains" issued to Murphy et al. incorporated herein by reference) is coated on a semiconductor substrate 100. However, in the prior art, there is no teaching of using the cloisonne approach to make multilevel structures and conducting polylines encapsulated by an insulating dielectric.

The conductor 200 is not limited to the exact materials used in the examples herein. Instead, the conductor 200 can be any material that includes photoactive photosensitive) agents and conductor elements. In other words, the invention can use any conventional conductor (that has photoactive agents added) or any conventional photoresist (that has conductive elements added). Any variation of specific chemical agents/elements would be well-known by one ordinarily skilled in the art once provided with this disclosure.

Next, using standard photolithography and resist develop techniques, the conducting polymer 200 is exposed to a wet chemical developer which removes the exposed conducting polymer regions, leaving only conducting polymer lines 300 on top of the substrate 100 as shown in FIG. 6. This process does not require the formation, patterning and removal of a separate mask, as the conventional damascene process does.

FIG. 7 shows the final processing steps, whereby an insulating dielectric layer 350 is deposited over the entire structure followed by a CMP planarization of the insulator in order to create conducting polymer lines 300 separated by insulating layers 350. This results in a single layer of conducting lines embedded in an insulating matrix which can be used in many industry-required semiconductor applications, such as bed wiring for CMOS devices.

FIGS. 8 and 9 provide a flowchart of a traditional damascene method (FIG. 8), and the present novel cloisonne method (FIG. 9). More specifically, in item 800 in FIG. 8, the invention shows a deposit of a thin film insulator 20 on a substrate 10. Next, in item 802 the invention shows a normal photoresist 30 coated on the insulator 20. Then in item 804, the layer is subjected to exposure and the line openings are developed. Item 806 of the invention is the etching of the line openings in the insulator 20 and in item 808, the photoresist 30 is stripped off. Then, the metal line 60 and seed layers are deposited as in item 810. Next, in item 812, the invention shows a deposit of metal fill. And, finally, item 814 shows CMP planarization of the metallization.

Conversely, FIG. 9 shows the depositing a photosensitive conducting polymer 200 in item 900. Then, in item 902, the exposure and development of the conducting polymer 200 occurs. Referring to item 904 the deposit of the insulator 20 is shown. And finally, in item 906, the CMP planarization of the insulator 20 occurs. As is clearly evident, the number of processing steps is far fewer in the cloisonne method compared to the damascene method, thereby resulting in less processing time, and consequently reducing costs.

Figure 10:
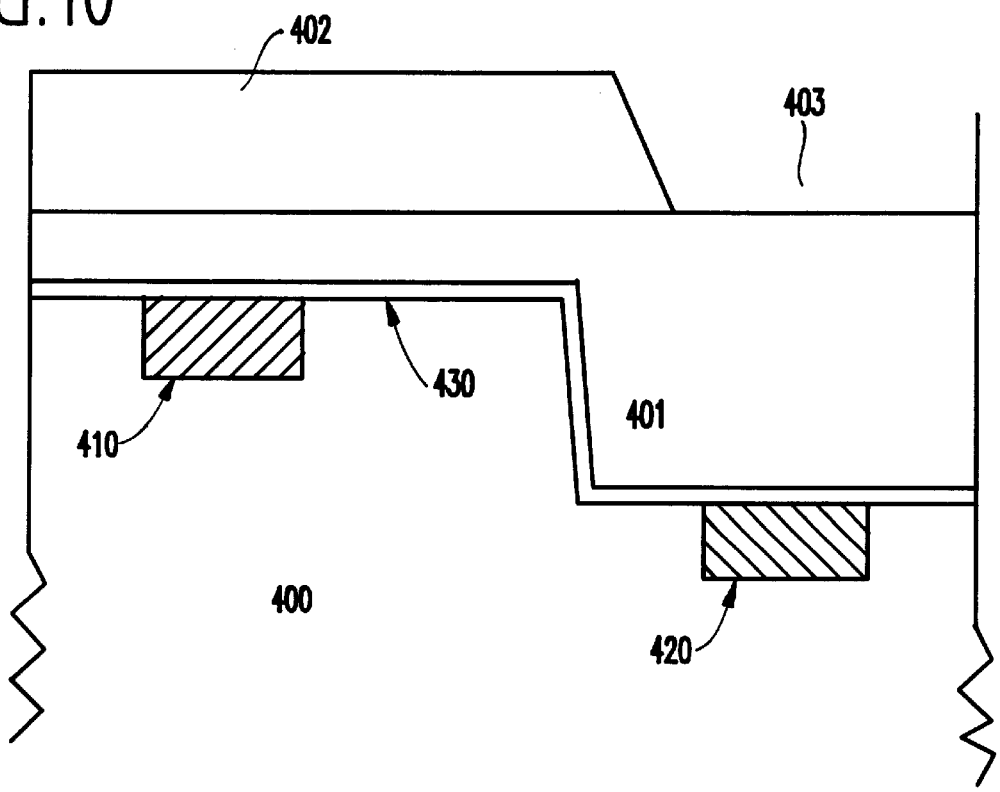
FIG. 10 is a cross-sectional view of a conventional interconnect structure.
Figure 11:
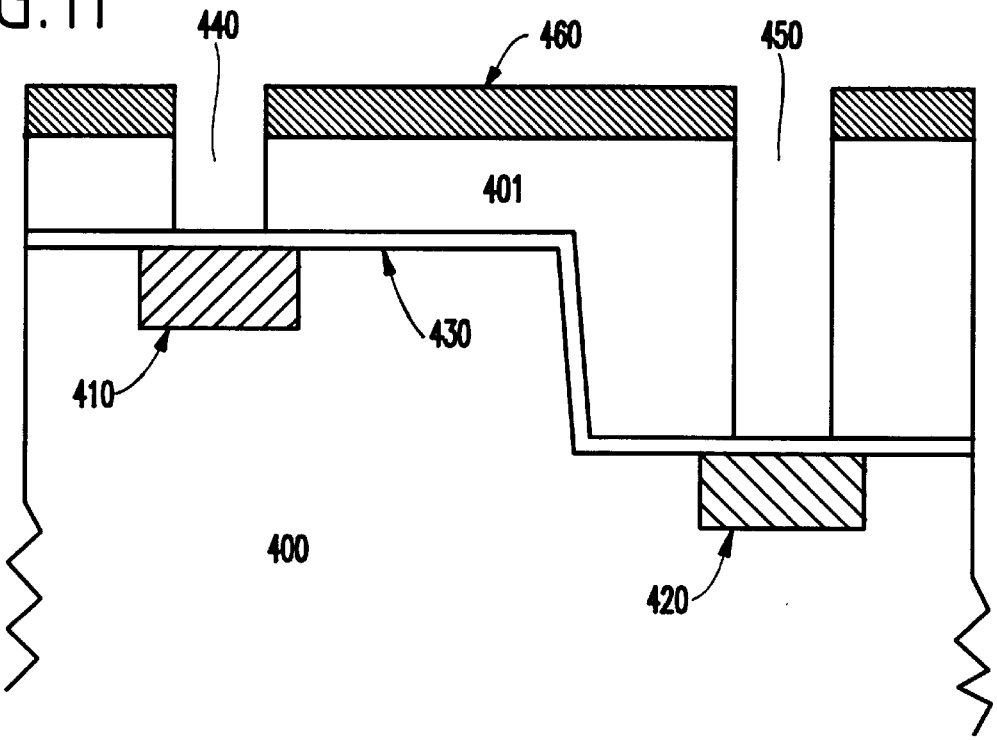
FIG. 11 is a cross-sectional view of a conventional interconnect structure.
Figure 12:
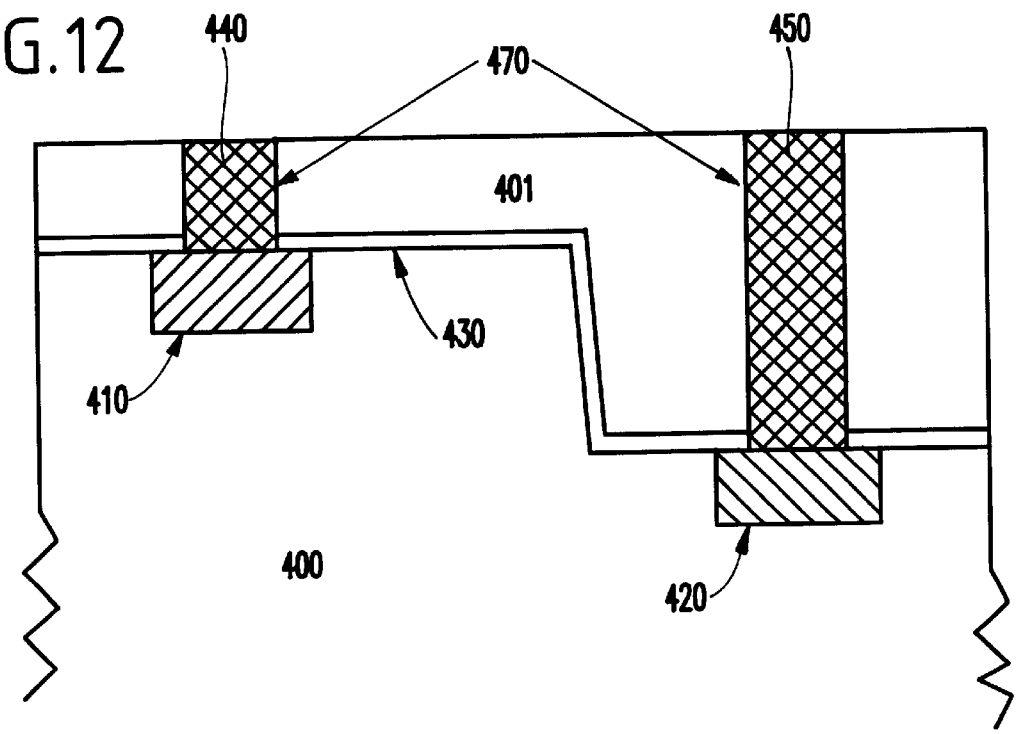
FIG. 12 is a cross-sectional view of a conventional interconnect structure.

Self-planarizing conductor systems generally are processed with the damascene method, and are generally known to those skilled in the art as well. FIGS. 10 through 12 show the prior art embodiments of a self-planarizing conductor system, using the standard damascene processing techniques described above.

Specifically, FIG. 10 illustrates a method and structure for the formation of an interconnect over a region of substrate 400, which as shown is comprised of step height regions 402 and 403 which are introduced by prior processing and structures. An inter-level dielectric layer 401 will have a step height between regions 402 and 403, and will require a planarization step such as a CMP. An etchstop layer 430 and conductor elements 410 and 420 are also shown, and are further described below.

FIG. 11 shows a photoresist layer 460 applied to the layer 401 (after CMP), and via patterns 440 and 450 formed using well-known lithography and dry etching techniques. An etchstop layer 430 prevents the overetch of via 440 and 450 during the etching of patterns 440 and 450.

FIG. 12 shows a cross-sectional view of the interconnect structure in FIG. 11 after additional processing. Conductor elements 410 and 420 are shown at different levels of step height in inter-level dielectric 401. A CMP or other process step is required to planarize inter-level dielectric 401 (shown in FIG. 11) before via 470 can be formed. An etch stop layer 430 is also required to prevent the erosion of conductor elements 410 and 420 during the anisotropic etching of via/wire structure 470.

Figure 13:
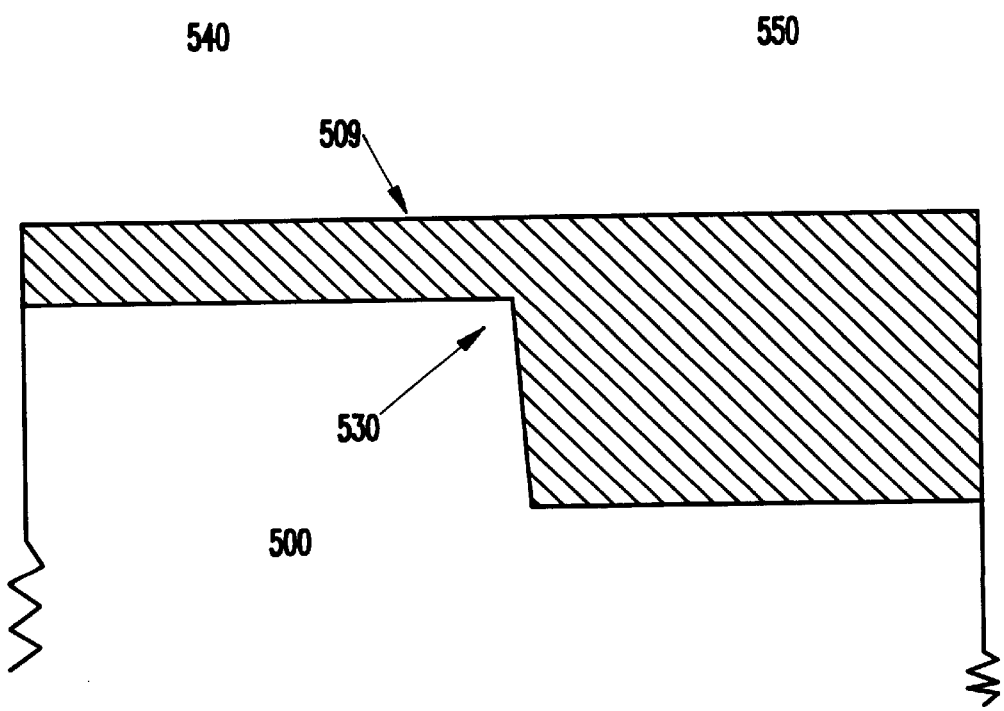
FIG. 13 is a cross-sectional view of an interconnect structure according to the present invention.

FIGS. 13 through 16 show the inventive method and structure of the self-planarizing aspect of the conductive polymer system. FIG. 13 first shows conductive polymer material 509 applied on substrate 500 using a well-known spin-on application. Once again, the dielectric 500 has a step 530 caused by previous processing. However, because the polymer 509 is applied in a spin-on application, it fills-in the step 530 and naturally creates a planar surface, without the need for any additional planarization techniques, such as CMP.

Figure 14:
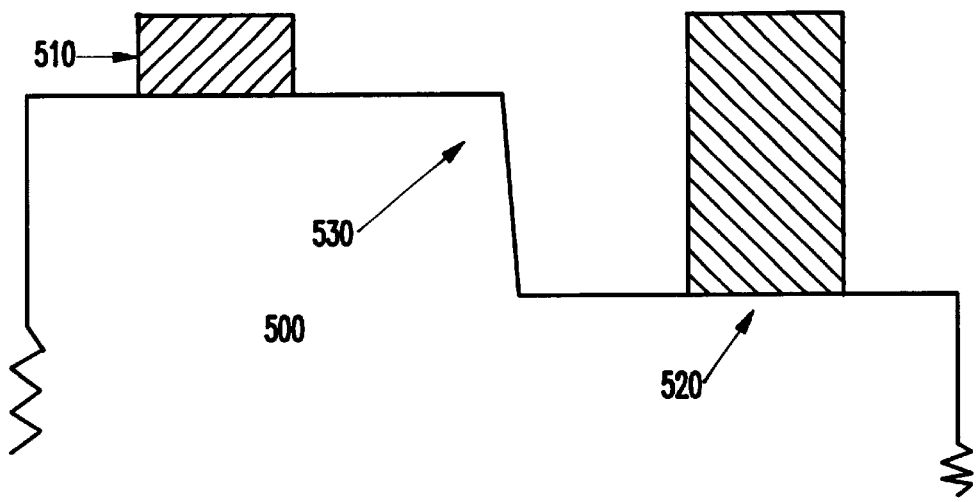
FIG. 14 is a cross-sectional view of an interconnect structure according to the present invention.

The conductive polymer material 509 will be substantially level and planar over the step height regions 540 and 550. Patterning of the polymer 509 into conductive vias 510, 520 using either conventional lithographic and dry etch techniques, or exposure of a photosensitive component of the conductor polymer, is shown in FIG. 14. Preferably, the invention uses the above-described cloisonne method to pattern the polymer 509. As described above, this eliminates the need for mask formatting pattering, and removal and simply allows the polymer 509 to be patterned directly with a photo exposure and developer solution.

Figure 15:
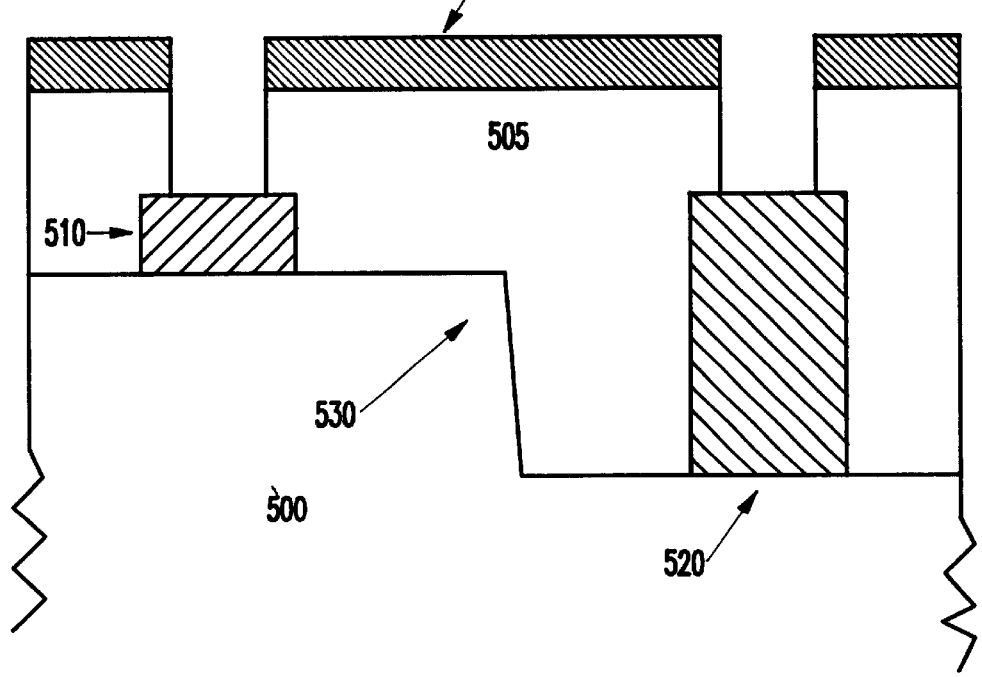
FIG. 15 is a cross-sectional view of an interconnect structure according to the present invention.
Figure 16:
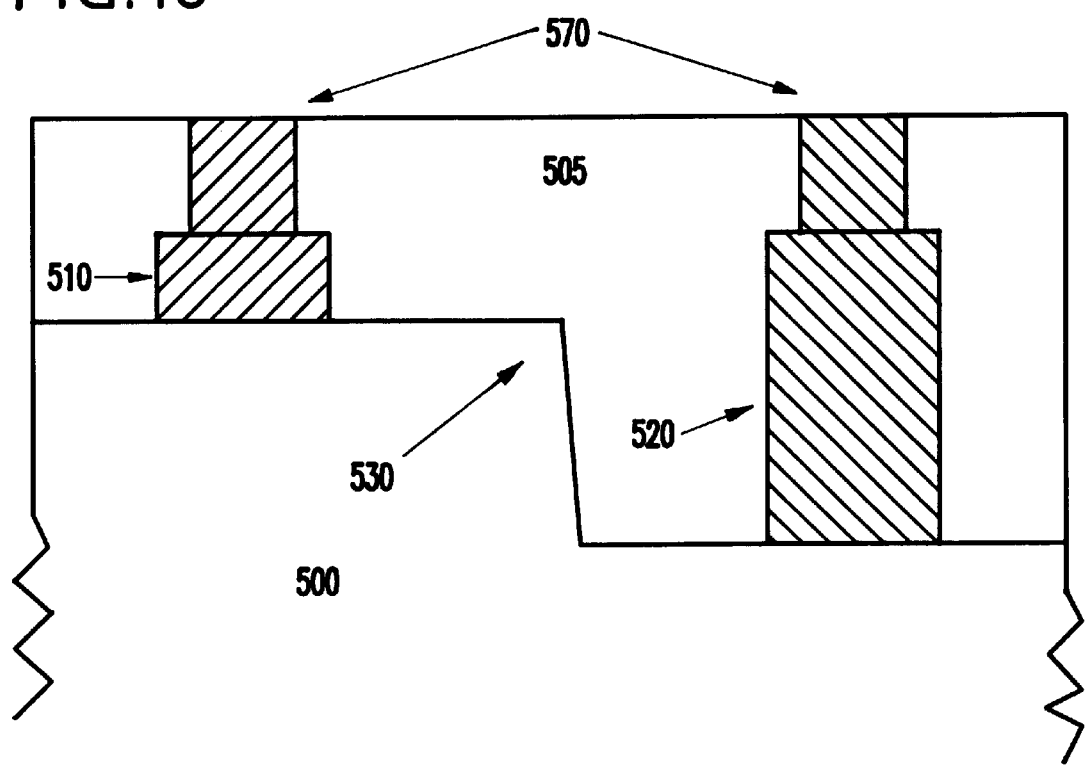
FIG. 16 is a cross-sectional view of an interconnect structure according to the present invention.

FIG. 15 shows a photoresist layer 560 applied to the layer and patterned. Any conventional etching process is performed to create openings 540, 550 which, as shown in FIG. 16, are filled in a conventional damascene process with additional conductive material 570. The structure is then planarized using any conventional method, such as CMP.

The self-planarizing polymer conductor 590 eliminates the need for etchstop layer 430 shown in prior art FIGS. 10–12, and also eliminate the need for a separate planarization step (such as CMP) of inter-level dielectric 401. The CMP of inter-level dielectric 401 introduces a variation of the resulting thickness of the inter-level dielectric 401, thereby degrading the manufacturing tolerance of the overall structure.

While the invention has been described in terms of preferred embodiments, those skilled in the art will recognize that the invention can be practiced with modification within the spirit and scope of the appended claims.

What is claimed is:

1. A method for producing metallic polymer conductor lines comprising:
   depositing a photosensitive conducting polymer on a substrate;
   exposing said conducting polymer with a patterned light source;
   developing said conducting polymer using a wet chemical developer to remove portions of said exposed conducting polymer regions;
   depositing an insulating layer; and
   planarizing said insulating layer.

2. The method of claim 1, wherein said photosensitive conducting polymer is one of pyrrole, aniline, and a silver salt.

3. The method of claim 1, wherein said step of planarizing said insulating layer comprises chemical mechanical polishing.

4. The method in claim 1, wherein said photosensitive conducting polymer acts as its own mask.

5. The method in claim 1, wherein said photosensitive conducting polymer comprises a metallic polymer with a photoactive agent.

6. The method in claim 1, wherein said depositing of said photosensitive conducting polymer is performed before said exposing process.

7. A method for producing metallic polymer conductor lines comprising the steps of:

- depositing a self-planarizing conductive polymer material on a substrate using a spin-on application;
- depositing a photosensitive conducting polymer on a substrate;
- exposing said conducting polymer with a patterned light source;
- developing said conducting polymer using a wet chemical developer to remove portions of said exposed conducting polymer regions;
- depositing an insulating layer; and
- planarizing said insulating layer.

8. The method of claim 7, wherein said photosensitive conducting polymer is one of pyrrole, aniline, and a silver salt.

9. The method of claim 7, wherein said step of planarizing said insulating layer comprises chemical mechanical polishing.

10. The method in claim 7, wherein said photosensitive conducting polymer acts as its own mask.

11. The method in claim 7, wherein said photosensitive conducting polymer comprises a metallic polymer with a photoactive agent.

12. The method in claim 7, wherein said depositing of said photosensitive conducting polymer is performed before said exposing process.

13. A method of forming patterned conductors comprising:

- depositing a material on a substrate, wherein said material includes photoactive agents and conductive elements;
- exposing said material to a light source; and
- developing said photoactive agents in said material using a chemical developer to remove portions of said material and to allow a conductive pattern of said material to remain on said substrate.

14. The method in claim 13, further comprising depositing and planarizing an insulator to cover said conductive pattern.

15. The method in claim 13, wherein said substrate has a stepped surface and wherein said material is deposited in a spin-on application that forms a planar upper surface.

16. The method in claim 13, wherein said material comprises a metallic polymer with a photoactive agent.

17. The method in claim 13, wherein said material comprises one of pyrrole, aniline, and a silver salt.

18. The method in claim 13, wherein said material is patterned without the use of a separate mask.

19. The method in claim 13, wherein said material acts as its own mask.

20. The method in claim 13, wherein said depositing of said material is performed before said exposing process.

* * * * *